United States Patent [19]

Tormey et al.

[11] Patent Number: 5,725,808
[45] Date of Patent: Mar. 10, 1998

[54] MULTILAYER CO-FIRED CERAMIC COMPOSITIONS AND CERAMIC-ON-METAL CIRCUIT BOARD

[75] Inventors: Ellen Schwartz Tormey, Princeton Junction; Ashok Naryan Prabhu, East Windsor, both of N.J.

[73] Assignees: David Sarnoff Research Center, Inc., Princeton, N.J.; Sharp K.K., Osaka, Japan

[21] Appl. No.: 652,052

[22] Filed: May 23, 1996

[51] Int. Cl.⁶ .......................... C03C 3/066; C03C 10/04; C03C 10/02
[52] U.S. Cl. .................. 252/514; 501/5; 501/10; 501/17; 501/19; 501/32; 501/79; 428/432; 428/433
[58] Field of Search ................ 501/5, 8, 10, 17, 501/19, 16, 32, 79; 252/514; 428/432, 433

[56] References Cited

U.S. PATENT DOCUMENTS

| | | | |
|---|---|---|---|
| 4,358,541 | 11/1982 | Andrus et al. | 501/5 |
| 4,547,467 | 10/1985 | Barth et al. | 501/19 |
| 4,830,988 | 5/1989 | Hang et al. | 501/17 |
| 5,001,087 | 3/1991 | Kubota et al. | 501/79 |
| 5,491,116 | 2/1996 | Beall et al. | 501/5 |
| 5,581,876 | 12/1996 | Prabhu et al. | 29/851 |

FOREIGN PATENT DOCUMENTS

| 1151860 | 5/1969 | United Kingdom | 501/79 |
|---|---|---|---|

*Primary Examiner*—Karl Group
*Attorney, Agent, or Firm*—William J. Burke

[57] ABSTRACT

A ceramic mixture of a crystallizable $ZnO$—$MgO$—$B_2O_3$—$SiO_2$ glass mixed with a non-crystallizing lead-based glass and one or more oxide fillers forms a fired ceramic that has a TCE compatible with that of kovar. Green tapes made from the ceramic mixture aligned with a kovar support substrate when fired have excellent dielectric and low loss properties.

17 Claims, 2 Drawing Sheets

MULTILAYER CO-FIRED CERAMIC COMPOSITIONS AND CERAMIC-ON-METAL CIRCUIT BOARD

This invention relates to multilayer ceramic printed circuit boards. More particularly, this invention relates to glass compositions that can form fired ceramics on metal supports that do not shrink in lateral directions.

BACKGROUND OF THE INVENTION

Low temperature multilayer ceramic circuit boards are known that are suitable for use with low melting temperature conductive metals, such as silver, gold and copper. They have a low thermal coefficient of expansion (TCE) and thus some of them are compatible with silicon or gallium arsenide. These ceramic circuit boards are made from glasses that can be fired at low temperatures, i.e., less than 1000° C. The multilayer circuit boards are made by admixing glasses with organic materials, including resin, solvents, dispersants and the like, and forming a thin flat tape known as green tape. The green tape can be punched and fired, first to remove the organic materials, and then to convert the glass to a devitrified state. A circuit can be screen printed onto the green or fired ceramic tape using a conductive ink formulation comprising a conductive metal powder, an organic vehicle and a powdered glass, often the same or a similar glass to that used to make the green tape.

When multiple green tapes having circuits screen printed thereon are to be stacked, via holes are formed in the tape and filled with via fill ink formulations, also made from conductive metal, glass and an organic vehicle, to fill the via holes and to provide electrical contact between the circuits on the various green tape layers. The patterned green tape layers are aligned and compressed using heat and pressure prior to firing.

These multilayer circuit boards have been in commercial use for some years, but they have several disadvantages. The green tapes shrink at least 15% in all directions during firing, which must be compensated for in advance by building in tolerances for the green tape layers and via holes. However, it is difficult to keep the circuits to tight tolerances. The thermal conductivity of glass is low, and thus heat dissipation is a problem. In addition, the stand-alone multilayer circuit boards are weak as compared to materials such as alumina or aluminum nitride, which are also used for multilayer circuit boards. However, these latter materials, while they have good thermal conductivity and strength, also shrink during firing, and they must be fired at much higher temperatures and in a reducing atmosphere, rather than fired in air at lower temperatures. Thus low melting conductive metals cannot be used with stand alone multilayer circuit boards, and high melting refractory metals, such as tungsten or molybdenum, must be used as circuit materials. However, these metals have lower conductivities than silver, gold or copper, and thus the resultant printed circuit boards have inferior electrical properties to those using low melting temperature metals such as silver, gold or copper.

More recently, the multilayer circuit boards have been adhered to support substrates to increase the strength of the composite board. These support substrates generally have a metal core that can be coated with a glaze that adheres the ceramic tape to the metal support substrate during co-firing. During firing, this glaze reduces the shrinkage in the lateral x,y directions, so that most, if not all, of the shrinkage occurs in the z direction, i.e., perpendicular to the metal support substrate. Suitable glaze compositions are described in copending application Ser. No. 08/379,263 to Prabhu et al filed Jan. 27, 1995, now U.S. Pat. No. 5,581,876 issued Dec. 10, 1996, and incorporated herein by reference.

However, the ceramic must have a TCE that closely matches that of the conductive substrate support material in the range of the firing temperature to prevent delamination or even cracking of the ceramic. Thus glass-ceramics that have a TCE matched to various metal core materials have also been developed. A co-firable ceramic which has a TCE of 9–13 ppm/°C. over the temperature range of room temperature to 250° C. on a copper clad stainless steel board is known. A ceramic which has a TCE of 4.5–6 ppm/°C. over the temperature range of room temperature to 300° C. for use with a copper clad, molybdenum metal board is also known and has been disclosed in copending U.S. application Ser. No. 08/379,266 to Kumar et al filed Jan. 27, 1995, also incorporated herein by reference.

However, the search for additional glass compositions that have a TCE closely matched to various metal or alloy compositions, particularly to KOVAR, a name given to a group of alloys, such as an alloy containing 53.8 weight percent of iron, 29 weight percent of nickel, 17 weight percent of cobalt and 0.2 weight percent of manganese. These alloys display a sharp change in the coefficient of expansion at certain temperatures.

KOVAR is an excellent material for use as a support substrate because KOVAR has a TCE closely matched to gallium arsenide in the room temperature to 300° C. range, and it is a low cost material. However, KOVAR has somewhat unusual TCE characteristics, as is shown in FIG. 1. FIG. 1 is a graph of the TCE of KOVAR versus temperature. The TCE remains fairly low up to a temperature of about 400° C. but thereafter the TCE rises rapidly from 5 ppm/°C. to 10 ppm/°C. above its Curie temperature between 450°–800° C.

This behavior can be contrasted with other useful support substrates, as shown in FIG. 2. FIG. 2 is a graph of TCE versus temperature between 100° and 600° C. for various support board materials. Curve A is nickel clad molybdenum; curve B is copper clad molybdenum; curve C is molybdenum alone; and curve D is KOVAR. It is apparent that kovar has a quite different curve from that of other support substrate materials, whose TCE remains fairly constant with changes in temperature.

Known ceramic compositions do not match the TCE of KOVAR at all temperatures of interest, and thus new ceramic compositions were required for co-firing on KOVAR.

SUMMARY OF THE INVENTION

We have found certain glass compositions which can be mixed with non-crystallizing glasses to form green tape compositions which are suitable for metal core circuit boards. Oxide fillers can also be added to further modify the properties of the fired ceramic. They can be fired on the metal or alloy core support substrate with reduced shrinkage in the x and y lateral directions, and they have a low firing temperature, compatible with the use of low melting point conductors such as gold, silver or copper. These glasses are chosen from the $ZnO$—$MgO$—$B_2O_3$—$SiO_2$ glass systems.

Conductor inks, via fill inks, and top conductor inks can also be made using the glasses of the invention to produce ceramic circuit boards that have low dielectric loss properties.

DETAILED DESCRIPTION OF THE INVENTION

Figure 1:
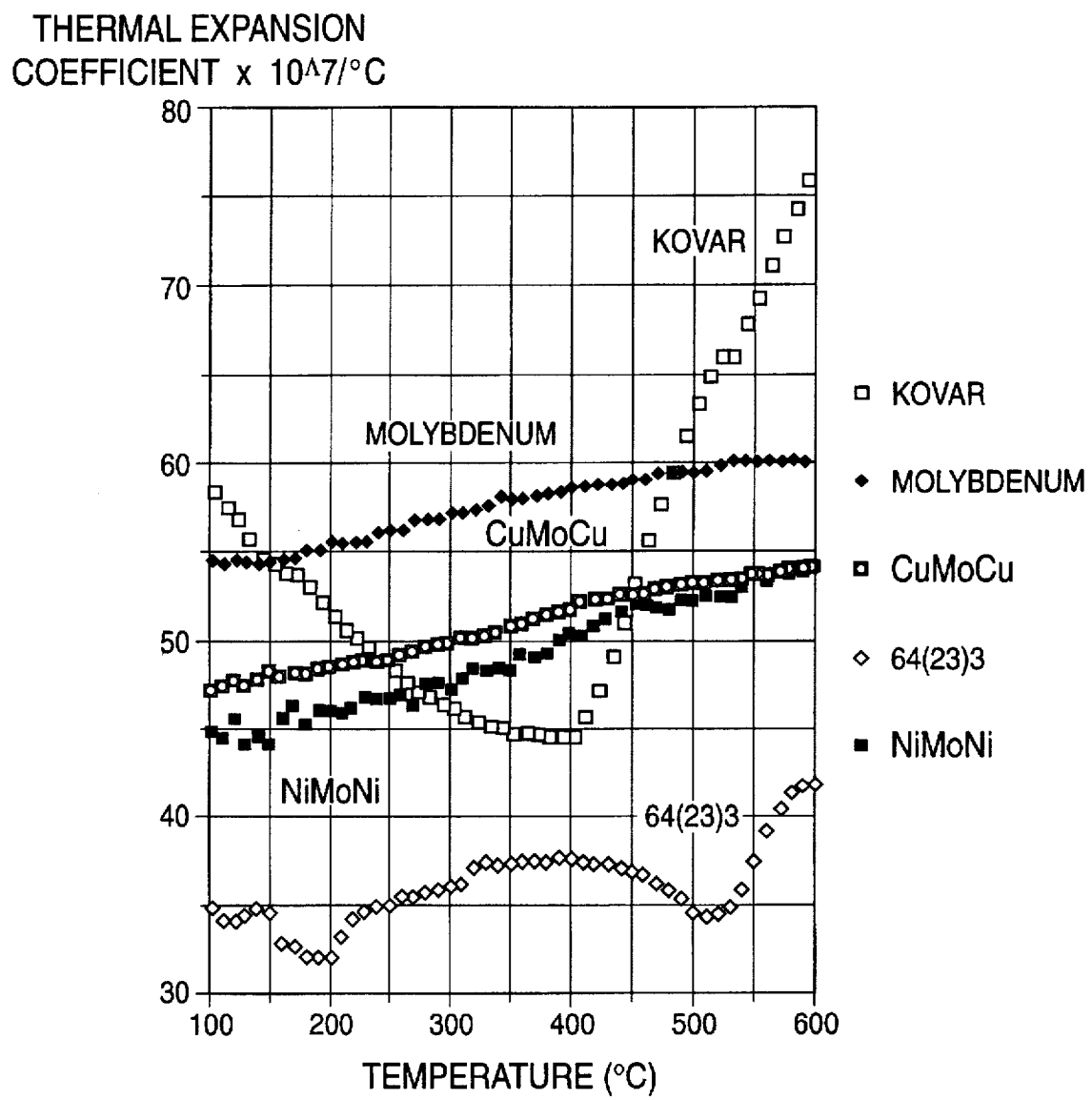
FIG. 1 is a graph of TCE versus temperature for a KOVAR alloy.
Figure 2:
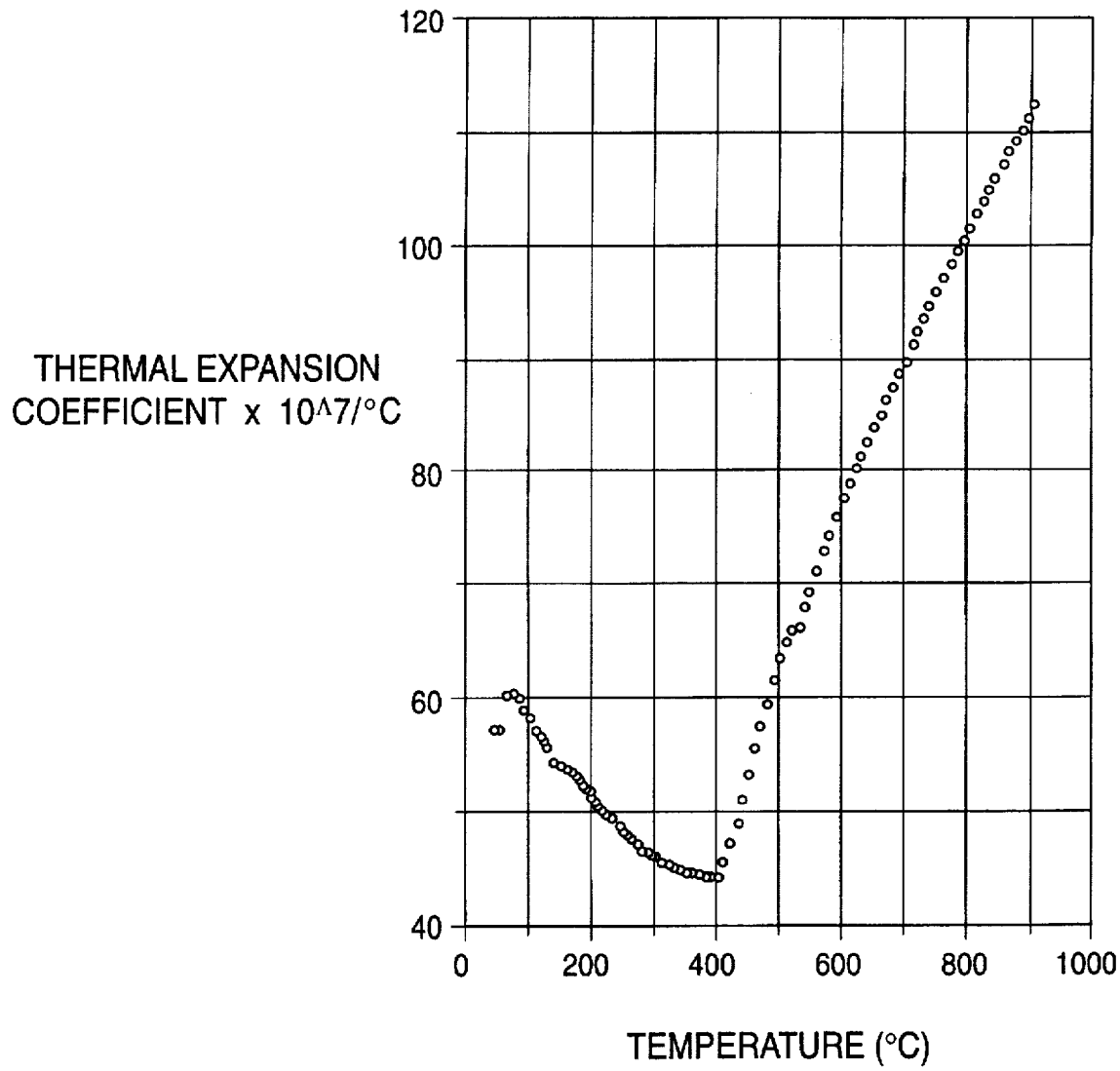
FIG. 2 is a graph of TCE versus temperature for a number of support board materials.

Various materials are known to provide the support substrates useful herein, including stainless steel, copper clad stainless steel, copper clad Invar®, a trademark of Carpenter Technology for a ferronickel alloy which has a low TCE, and KOVAR, a ferro/nickel/cobalt alloy and a tradename of Carpenter Technology. A preferred support substrate is made from KOVAR clad or plated with about 25 micrometers of copper, which in turn is coated with about 25 micrometers of nickel. These core support substrates are commercially available; they have an overall thickness of about 625 micrometers, a TCE of 5.8 ppm/°C. from room temperature to 300° C. and a thermal conductivity in the z direction of 21.8 watts/m°k.

The preferred core support substrate material as described above is prepared for use herein by heat treatment in air to oxidize the nickel, which improves the adhesion of a subsequently deposited bonding glass layer. The oxidized core support substrate is then coated with a bonding glass. The bonding glass is known and is made by combining a suitable glass powder, i.e., a glass having a TCE closely matched to that of the support substrate material, with an organic binder and a solvent to form a screen printable composition in known manner. A suitable bonding glass is a mixture of the oxides of calcium-aluminum-zinc-boron, described further below. A small amount, e.g., about 5–6 percent by weight, of copper powder can be added to the bonding glass to enhance the adhesion of the ceramic to the metal core. The bonding glass composition on the metal support substrate is then fired in air at 700°–800° C. to produce a fired glass layer about 35 micrometers in thickness on the support substrate.

Green tape layers are fabricated, punched with via holes which are then filled by screen printing using via fill inks, followed by screen printing a conductor pattern thereon in conventional manner, using conventional conductor inks.

The green tape stacks are then aligned over the prepared support substrate and fired. A binding glue can be applied over the glazed support substrate to improve adhesion of the multilayer green (unfired) ceramic to the support substrate. During firing the bonding glass (glaze), which has a lower softening temperature than that of the glass used to form the multilayer ceramic green tape, softens and adheres the ceramic tape to the metal support substrate, preventing shrinkage in the x,y directions during firing; the result is that all of the shrinkage occurs in the z direction. Thus the alignment of the ceramic layers to each other, and the stack to the support substrate, remains undisturbed during firing.

We have found that a crystallizing glass of the ZnO—MgO—$B_2O_3$—$SiO_2$ system can be combined with a secondary, non-crystallizing glass, and with oxide filler materials to produce glass-ceramics that have the desired expansion characteristics and the properties required.

The crystallizing glasses of the invention contain, in weight percent, from 20–55%, preferably 25–30% of ZnO; from 10–30%, preferably 20–28% of MgO; from 10–35%, preferably 15–20% of $B_2O_3$; from 10–40%, preferably 20–30% of $SiO_2$; and up to 10%, preferably 3–7% of $Al_2O_3$ and from 0–3%, preferably 0–2% of $Co_3O_4$.

Table I below sets forth the desired properties for the fired glass-ceramic compositions of the invention.

TABLE I

| | |
|---|---|
| TCE (25–300° C.) | 5–7 ppm/°C. |
| Dielectric Constant @ 1 GHz | 5–10 ± 2% |
| Dielectric Loss @ 1 GHZ (tan δ) | ≦0.002 |
| Volume Resistivity | ≧$10^{13}$ ohm-cm |
| Surface Resistivity | >$10^{12}$ ohm-cm |
| Chemical Durability and plating solutions | Resistant to acids, alkalis |

TABLE I-continued

| | |
|---|---|
| Buried Conductor Resistance | <4 mΩ/square |
| Via Conductor Resistance | <1 mΩ/via |

A series of ZnO—MgO—$B_2O_3$—$SiO_2$ glasses were prepared and their TCE and other properties measured. The oxides were combined and melted at 1550° C. for two hours, and the resultant glass quenched between steel rollers and ground in a ball mill until the median particle size was about 8–13 micrometers (μm). The compositions of the glasses are summarized below in Table II.

TABLE II

| | Glass Composition, Weight percent | | | | | |
|---|---|---|---|---|---|---|
| Sample No. | ZnO | MgO | $B_2O_3$ | $SiO_2$ | $Co_3O_4$ | $Al_2O_3$ |
| 1 | 40.0 | 22.0 | 26.8 | 11.2 | | |
| 2 | 40.0 | 26.3 | 22.5 | 11.2 | | |
| 3 | 50.0 | 10.0 | 25.0 | 15.0 | | |
| 4 | 25.9 | 25.7 | 19.6 | 28.8 | | |
| 5 | 25.9 | 25.8 | 23.3 | 25.0 | | |
| 6 | 25.9 | 25.7 | 21.5 | 27.0 | | |
| 7 | 25.9 | 25.8 | 22.5 | 25.8 | | |
| 8 | 25.9 | 25.8 | 18.0 | 30.3 | | |
| 9 | 30.0 | 25.0 | 20.0 | 25.0 | | |
| 10 | 29.4 | 24.5 | 19.6 | 24.5 | 2.0 | |
| 11 | 24.7 | 24.5 | 18.6 | 27.4 | | 4.8 |

The glasses crystallize on firing to form various crystal phases including suanite ($Mg_2B_2O_5$); enstatite ($MgSiO_3$); and willemite ($Zn_2SiO_4$). The latter has a lower expansion characteristic than the other crystal phases.

A green tape was prepared from each glass, five layers of the green tape were stacked and laminated to a KOVAR support substrate coated with a bonding glass of Ca—Al—Zn borate and the laminate fired in air at a peak temperature of 850°–900° C. The TCE and x, y shrinkage were measured for each glass to determine the TCE match of the glass to KOVAR. The chemical durability of each glass was measured by immersing the fired glass in an electroless nickel plating bath having a pH of 6.7 for one hour at 89° C. and observing the change in the finish of the ceramic. A duller, powdery finish indicates poor chemical durability, whereas an unchanged surface indicates good durability.

The dielectric properties of each glass were also measured on five layer tape stacks fired without the support substrate in air, also between 850°–900° C., using a resonant cavity wave guide at a frequency of 15–17 GHz in known manner. The results are given below in Table III.

TABLE III

| Glass Sample No. | TCE Rel. to KOVAR Fired at 850–900° | Dielectric Props. @ 15–17 GHz | | Chem. Dura-bility | x, y Shrinkage % |
|---|---|---|---|---|---|
| | | K | tan δ | | |
| 1 | match | 7.0 | 0.0016 | poor | 0.5–3.0 |
| 2 | low | | very high | | 1.9–2.3 |
| 3 | low | | | | 1.1–1.4 |
| 4 | high | 5.1 | 0.0021 | fair | |
| 5 | high | | | good | 8.0–14.6 |
| 6 | high | | | | 3.5–4.6 |
| 7 | high | 6.0 | 0.0026 | good | 7.5–15.0 |
| 8 | low | 6.2 | 0.0018 | | 8.7–13.9 |
| 9 | low | 6.5 | 0.0020 | good | 6.7–12.2 |
| 10 | low | 6.1 | 0.0024 | | |

Although Sample No. 1 has a TCE characteristic matched to that of KOVAR and a low dielectric loss, it has poor chemical durability and a low crystallization temperature of 725° C., which inhibits densification.

In an attempt to improve the chemical durability and densification, this glass was mixed with lead-based, non-crystallizing glasses. However, the resultant ceramic had a reduced TCE and an increased dielectric loss. Two such ceramic compositions are given below in Table IV.

TABLE IV

| Ceramic Sample No. | Composition Wt % | TCE Rel. to KOVAR fired at 850–900° | Diel. Prop. @ 15–17 GHz K | tan δ | Chem Dur. | x, y Shrink % |
|---|---|---|---|---|---|---|
| 12 | Glass + 25% Pb glass A* | sl. low | 6.5 | 0.0033 | good | 1.2–1.7 |
| 13 | Glass + 25% Pb glass B** | sl. low | 6.8 | 0.0033 | good | 1.0–1.3 |

*Glass A is made from the following oxides: 35.6% PbO, 8.0% $Al_2O_3$, 46.2% $SiO_2$ and 10.2% ZnO, all % by weight.
**Glass B is made from the following oxides: 50.0% PbO, 10.1% $Al_2O_3$, 39.9% $SiO_2$, all % by weight.

These ceramics had a lowered TCE and an increased dielectric loss.

Suitable lead-based non-crystallizing glasses that can be employed herein are made from the following oxides:

PbO 30–80% by weight $SiO_2$ 15–50% by weight $Al_2O_3$ up to 10% by weight $B_2O_3$ up to 15% by weight ZnO up to 10% by weight Additional ceramics were prepared from glasses Sample Nos. 4, 9 and 10, to which varying amounts of lead-based glasses and oxide fillers were added. The compositions and dielectric and electrical properties are summarized below in Table V.

TABLE V

| Ceramic Sample No. | Composition Wt % | TCE Rel. to KOVAR fired at 850–900° | Diel. Prop. @ 15–17 GHz K | tan δ | Chem Dur. | x, y Shrink % |
|---|---|---|---|---|---|---|
| 14 | Glass 4, 10% glass C*** | sl. high | 6.0 | 0.0025 | good | 11.2–14.0 |
| 15 | Glass 4, 10% Pb silicate, 5% $Al_2O_3$, 5% quartz | sl. high | 5.5–6.3 | 0.0042 | good | 0.21 |
| 16 | Glass 9 + 10% glass C, 10% quartz | sl. high | 6.0–6.2 | 0.0029 | good | 0.02 |
| 17 | Glass 9 + 9.4% glass C, 15.0% fosterite | sl. high | 6.2 | 0.0022 | good | nil |

***Glass C is made from the following oxides: 42.0% PbO, 10.0% $Al_2O_3$, 38.0% $SiO_2$, 10.0% ZnO, all % by weight These ceramics had a slightly high TCE relative to KOVAR, but good chemical durability and good dielectric properties. However, the lateral shrinkage was too high (sample 14). Thus additional oxide fillers were added, as shown in ceramic samples No. 15–17. The lateral shrinkage was then greatly reduced, in one case (No. 17) to zero.

Suitable oxide fillers for forming the present ceramic compositions include alumina, cordierite, quartz, cristobalite, forsterite and willemite. These materials serve to control the shrinkage and to further modify the TCE. With the addition of a second oxide filler, the desired dielectric properties, shrinkage characteristics and a TCE matched to KOVAR can all be achieved.

The preferred glass-ceramic compositions useful herein contain the following materials: crystallizing glass of the invention, 50–85%, preferably 70–80% by weight; Pb-based, non-crystallizing glass, 3–30%, preferably 8–12% by weight; first oxide filler, high expansion type, 5–35%, preferably 6–12% by weight; and second oxide filler, low expansion type, 0–25%, preferably 1–5% by weight.

Additional experimental results are shown below in Table VI.

TABLE VI

| Ceramic Composition No. Wt. % | TCE Rel. to kovar fired at 850–900° | Diel. Prop. 15–17 GHz K | tan δ | Vol. Resist Ω-cm |
|---|---|---|---|---|
| 18 Glass 9 + 9.6% glass C, 8.5% forsterite, 5.0% cordierite | sl. low | 6.3–6.7 | 0.0026–0.0030 | 1.24 × $10^{13}$ |
| 19 Glass 9 + 19.5% glass C, 8.5% forsterite, 5.0% cordierite | sl. low | 6.4–6.5 | 0.0031–0.0035 | |
| 20 Glass 9 + 9.6% glass C, 9.5% forsterite, 4.0% cordierite | sl. low | 6.2 | 0.0025 | |
| 21 Glass 9 + 10.6% glass C, 9.5% forsterite, 4.0% cordierite | sl. low | 6.6 | 0.0034 | |
| 22 Glass 9 + 9.5% glass C, 9.0% forsterite, 4.5% cordierite | sl. low | 6.5 | 0.0028 | 3.8 × $10^{13}$ |
| 23 Glass 10 + 9.6% glass C, 9.0% forsterite, 4.5% cordierite | sl. low | 6.4– | 0.0026– | 1.3 × $10^{14}$ |
| 24 Glass 10 + 9.6% glass C, 10.0% forsterite, 1.5% cordierite | match | 6.4 6.8* | 0.0023 0.001* | 1.5 × $10^{14}$ |
| 25 Glass 9 + 9.6% glass C, 10.0% forsterite, 1.5% cordierite | match | 6.2 | 0.0025 | |

* @ 1 GHz

It is apparent that compositions No. 24 and 25 have the best TCE match to KOVAR, and in addition have excellent overall properties.

Green tape compositions are prepared generally from about 40–75% by weight of a ceramic mixture of the glass employed, from 1.2 to 22.5% by weight of a non-crystallizing glass, from 2–45% by weight of an oxide filler, and an organic vehicle. A typical formulation was made from the following ingredients: Glass No. 9, having a median particle size of 10–12.5 μm, 57.34 weight percent; glass C, having a median particle size of 6.5–8 μm, 6.98 weight percent; forsterite, having a median particle size of 3–5 μm, 7.27 weight percent; cordierite, having a median particle size of 2–3 μm, 1.09 weight percent; a dispersant, 0.58 weight percent; a binder (Butvar B98, a product of Monsanto Co), 2.04 weight percent; a plasticizer (Santicizer 160 of Monsanto Co.) 1.36 weight percent; 11.67 weight percent of methyl ethyl ketone and 11.67 weight percent of anhydrous ethanol. The formulation was admixed to form a slurry and tape cast to form a green tape.

A co-firable silver based thick film conductor ink based on the glass compositions of the invention was also developed and tested. A typical ink includes 83.78 weight percent of silver powder, 0.65 weight percent of a glass of the invention; 1.22 weight percent of a dispersant, 0.88 weight percent of an ethyl cellulose resin, 0.80 weight percent of a resin such as Elvacite 2045 of ICI Americas, Inc., 3.32 weight percent of Texanol, a solvent from Eastman Chemical Products, Inc., 6.81 weight percent of terpineol solvent and 2.54 weight percent of butyl carbitol. This ink can be screen printed onto the green tape to form a printed circuit.

A silver-palladium conductor ink based on the glass compositions of the invention was also developed and tested as a top conductor ink. A typical top conductor ink includes a silver-palladium powder, such as K1P 3030-1 powder of the Degussa Corporation, 77.48 weight percent; 6.30 weight percent of a glass made (by weight) from 25.61 percent of BaO, 9.88 percent of $B_2O_3$, 6.24 percent of calcium oxide, 8.36 percent of $SiO_2$ and 49.91 percent of $Bi_2O_3$; 0.16 percent of copper powder, 1.29 percent of a dispersant, 0.93 percent of ethyl cellulose; 0.85 percent of Elvacite 2045 resin, a product of ICI Americas, Inc.; 3.50 percent of texanol, 7.21 percent of terpineol and 2.29 percent of butyl carbitol.

An alternative gold top conductor ink formulation was made from the following: 84.39 percent of gold powder, 0.93 percent of a dispersant, 0.47 percent of ethyl cellulose, 0.22 percent of Elvacite 2045, 0.17 percent of a thickener, Thixatrol ST, a product of Rheox, Inc..; 1.65 percent of texanol; 2.38 percent of terpineol; and 3.05 percent of butyl carbitol, all percentages by weight.

A via fill ink was also made from the following: 55.84 percent of silver powder; 22.30 filler glass B, 1.15 percent dispersant, 0.70 percent of ethyl cellulose, 8.01 percent of butyl carbitol, 1.77 percent of Elvacite 2045; 5.31 percent of terpineol; 1.40 percent of Thixatrol ST and 3.54 percent of a plasticizer, all percentages by weight.

Three to five layers of the above green tape made with ceramic composition No. 25 and each having 200 μm diameter punched vias, filled with the via fill ink, and a screen printed conductor pattern thereon as above, were stacked together and mounted on a nickel clad KOVAR support substrate and fired. A post fired Ag-Pd top conductor ink was pattern deposited on the top side of the fired substrate.

Although the invention has been exemplified in terms of specific compositions, it will be apparent that one skilled in the art can vary the exact ingredients and their amounts without departing from the spirit of the invention. These variations are meant to be included herein. The invention is meant to be limited only by the scope of the appended claims.

We claim:

1. A crystallizable glass composition comprising from 25–30% by weight of ZnO, from 20–28% by weight of MgO, from 15–20% by weight of $B_2O_3$, from 20–30% by weight of $SiO_2$, up to 10% weight of $Al_2O_3$, and $Co_3O_4$.

2. A ceramic mixture of a glass of claim 1 and a non-crystallizing glass wherein said non-crystallizing glass contains PbO, $Al_2O_3$ and $SiO_2$.

3. A ceramic mixture of claim 2 wherein said non-crystallizing glass contains from 30–80% by weight of PbO, from 15–50% by weight of $SiO_2$, up to 10% by weight of $Al_2O_3$, up to 15% by weight of $B_2O_3$ and up to 10% by weight of ZnO.

4. A ceramic mixture of claim 2 wherein said non-crystallizing glass additionally contains ZnO.

5. A ceramic mixture of claim 2 further including an oxide filler.

6. A ceramic mixture of claim 2 further including two or more oxide fillers.

7. A ceramic mixture of claim 4 wherein said oxide filler is selected from the group consisting of alumina, cordierite, quartz, cristobalite, forsterite and willemite.

8. A green tape composition comprising from 40–75% by weight of a ceramic mixture of the glass of claim 1, from 1.2 to 22.5% by weight of a non-crystallizing glass containing PbO, $Al_2O_3$ and $SiO_2$, from 2 to 45% by weight of oxide fillers, and an organic vehicle.

9. A green tape composition of claim 8 comprising from 70–75% by weight of said ceramic mixture.

10. A fired green tape composition of claim 8 on a metal support substrate.

11. A fired green tape composition of claim 8 on a a ferro/nickel/cobalt alloy support.

12. A fired green tape composition of claim 11 wherein said a ferro/nickel/cobalt alloy support has a bonding glass thereon.

13. A fired green tape composition of claim 12 wherein said bonding glass is a calcium oxide-aluminum oxide-zinc oxide-borate glass.

14. A low melting temperature conductive ink composition comprising a conductive metal powder selected from the group consisting of silver, gold and copper, the ceramic mixture of claim 2 and an organic vehicle.

15. A printed circuit board comprising a metal support adhered to a fired ceramic made from the composition of claim 2.

16. A printed circuit board comprising a a ferro/nickel/cobalt alloy support adhered to a fired ceramic made from the composition of claim 8.

17. A printed circuit board of claim 16 wherein said fired ceramic is adhered to both sides of said a ferro/nickel/cobalt alloy support.

\* \* \* \* \*